(12) United States Patent
Nash et al.

(10) Patent No.: US 9,031,838 B1
(45) Date of Patent: May 12, 2015

(54) METHOD AND APPARATUS FOR VOICE CLARITY AND SPEECH INTELLIGIBILITY DETECTION AND CORRECTION

(71) Applicant: Vail Systems, Inc., Deerfield, IL (US)

(72) Inventors: Alex Nash, Gurnee, IL (US); Mariano Tan, Henderson, NV (US); David Fruin, La Grange Park, IL (US); Todd Whiteley, Lake Forest, IL (US); Jon Wotman, Evanston, IL (US)

(73) Assignee: Vail Systems, Inc., Deerfield, IL (US)

( * ) Notice: Subject to any disclaimer, the term of this patent is extended or adjusted under 35 U.S.C. 154(b) by 0 days.

(21) Appl. No.: 14/330,713

(22) Filed: Jul. 14, 2014

Related U.S. Application Data

(60) Provisional application No. 61/846,461, filed on Jul. 15, 2013.

(51) Int. Cl.
  *G10L 15/00* (2013.01)
  *G10L 21/02* (2013.01)
(52) U.S. Cl.
  CPC ...................................... *G10L 21/02* (2013.01)
(58) Field of Classification Search
  USPC ............. 704/9, 226, 237, 243, 270, 210, 215, 704/225, 200, 206, 233, 272, 278, 231; 347/347
  See application file for complete search history.

(56) References Cited

U.S. PATENT DOCUMENTS

| | | | |
|---|---|---|---|
| 4,991,169 A | 2/1991 | Davis et al. | |
| 5,027,410 A | 6/1991 | Williamson et al. | |
| 5,471,527 A * | 11/1995 | Ho et al. | 379/347 |
| 5,497,373 A | 3/1996 | Hulen et al. | |
| 5,737,331 A | 4/1998 | Hoppal et al. | |
| 5,768,473 A | 6/1998 | Eatwell et al. | |
| 6,108,343 A | 8/2000 | Cruickshank et al. | |
| 6,144,937 A | 11/2000 | Ali | |
| 6,330,224 B1 | 12/2001 | Christie et al. | |
| 6,349,285 B1 | 2/2002 | Liu et al. | |
| 6,434,520 B1 * | 8/2002 | Kanevsky et al. | 704/243 |
| 6,993,480 B1 | 1/2006 | Klayman | |
| 7,050,869 B1 | 5/2006 | Katayama et al. | |
| 7,440,446 B2 | 10/2008 | Sim | |
| 8,467,321 B1 | 6/2013 | Groenjes et al. | |
| 2004/0086107 A1 | 5/2004 | Hodges et al. | |
| 2005/0216263 A1 | 9/2005 | Obranovich et al. | |
| 2008/0140385 A1 * | 6/2008 | Mahajan et al. | 704/9 |
| 2010/0299148 A1 * | 11/2010 | Krause et al. | 704/237 |
| 2011/0178799 A1 * | 7/2011 | Allen et al. | 704/226 |
| 2012/0221328 A1 | 8/2012 | Muesch | |

\* cited by examiner

*Primary Examiner* — Huyen Vo
(74) *Attorney, Agent, or Firm* — McGuireWoods LLP

(57) ABSTRACT

Systems, methods and apparatus are described herein for continuously measuring voice clarity and speech intelligibility by evaluating a plurality of telecommunications channels in real time. Voice clarity and speech intelligibility measurements may be formed from chained, configurable DSPs that can be added, subtracted, reordered, or configured to target specific audio features. Voice clarity and speech intelligibility may be enhanced by altering the media in one or more of the plurality of telecommunications channels. Analytics describing the measurements and enhancements may be displayed in reports, or in real time via a dashboard.

20 Claims, 12 Drawing Sheets

METHOD AND APPARATUS FOR VOICE CLARITY AND SPEECH INTELLIGIBILITY DETECTION AND CORRECTION

CROSS REFERENCE TO PRIOR APPLICATIONS

This application claims priority under 35 U.S.C. §119(e) to U.S. Provisional Patent Application No. 61/846,461, filed Jul. 15, 2013, titled "Method and Apparatus for Call Clarity and Intelligibility Detection and Correction," the disclosure of which is hereby expressly incorporated herein by reference in its entirety.

FIELD OF THE DISCLOSURE

This disclosure is directed to a method and an apparatus for measuring and removing voice clarity and speech intelligibility defects.

BACKGROUND OF THE DISCLOSURE

Effective verbal interactions require a speech path and participant environment with good clarity and intelligibility. In telecommunication system interactions (TSIs), such as voice calls, the speech path may include, for example, participant biological components (e.g., mouth, ears), audio transducer components (e.g., microphone, speakers, earphones), and all transmission components (e.g., line, switching/routing device, signal processing, etc.). However, many telecommunication system interactions have voice clarity and speech intelligibility issues. When present, as a result of any element of the speech path, such issues may have a dramatic effect on the quality and outcome of the verbal interaction. For example, TSIs using mobile phones can become frustrating and ineffective when they involve voice clarity issues resulting from excessive background noise, or speech intelligibility issues resulting from echo. TSIs in a teleconferencing environment can suffer from clarity issues due to low volume on the part of one participant, or intelligibility issues due to signal clipping on the part of another. When present, these issues can increase frustration and dramatically reduce the productivity of all participants in the teleconference. TSIs in a contact center environment, where efficiency and customer experience are paramount, can be negatively impacted by even minor voice clarity and speech intelligibility issues which often lead to longer interactions, and a disproportionate share of repeat interactions, as participants have to invest more effort in understanding and resolving the issues that led to the interaction. Moreover, voice clarity and speech intelligibility issues often diminish perceived agent performance in a contact center interaction, as customers place the burden of intelligibility and efficiency on the contact center agent. These, and other TSIs, can be especially problematic when any of the participants has some degree of hearing loss.

Effective verbal interactions maintain an intensity balance between the channels, with each channel measuring within about 5 dB of the other. Fluctuations in intensity can cause participants to struggle to hear audible elements of an interaction, or can create harsh "noisy" events that disrupt conversational flow. Such fluctuations may affect interaction dynamics. For example, high-frequency attenuation, low volume, and/or the existence of background noise adversely affect speech intelligibility, requiring repetition and lengthening the duration of the interaction. Intermittent noises within telecommunications interactions may adversely affect cognition and bias thinking towards more negative states. Harshness and noise may also have detrimental effects on social behavior, increasing anxiety, decreasing the willingness to help, and increasing the risk of hostile behavior. This is particularly important as once voice clarity and speech intelligibility issues affect a single party in an interaction, negative effects may spread to all parties in that interaction.

The variety of voice clarity and speech intelligibility issues affecting TSIs has created an unmet need for systems and methods to enhance voice clarity and/or speech intelligibility in real-time.

SUMMARY OF THE DISCLOSURE

According to an aspect of the disclosure, systems, methods, and apparatus are described herein that measure and remediate various voice clarity and/or speech intelligibility defects, including echo, noise, frequency response, and/or excessive/diminished/unbalanced volume, in real-time. While the disclosure uses as an example a phone interaction between two TSI participants, this is only one example of an implementation of aspects of the disclosure. The systems, methods, and apparatus are equally applicable to other types of voice telecommunication applications, such as, for example, mobile peer-to-peer calls, multi-party conference calls, the voice component of multi-player gaming interactions, interactive voice response (IVR) interactions, and various recorded voice interactions treated by speech analytics, etc. The systems, methods, and apparatus described herein may employ a plug-in architecture to address each possible voice clarity and/or speech intelligibility defect individually. Separate digital signal processors (DSPs), which may be software DSPs, address voice clarity and/or speech intelligibility elements, such as echo, noise, gain, and noise gating, and are applied in a non-destructive order. One advantage of this methodology is the ease with which new DSPs for treating emerging voice clarity and/or speech intelligibility elements, or revised algorithms for treating known issues, can be added or swapped into the chain of DSPs.

A method for evaluating and enhancing voice clarity and speech intelligibility in a real-time audio signal is described. The method may include separating the audio signal into individual audio channels, each individual audio channel representing one participant in the audio signal. For each individual audio channel, the method may further include measuring, by a custom digital signal processor (DSP) chain, one or more clarity/intelligibility-affecting parameters; determining, by the custom DSP chain, at least one clarity/intelligibility enhancement based on the one or more clarity/intelligibility-affecting parameters; performing the clarity/intelligibility enhancement; determining an individual clarity/intelligibility score for each clarity/intelligibility-affecting parameter; and combining the individual clarity/intelligibility scores to generate an aggregate clarity/intelligibility score. The method may further include outputting at least one individual clarity/intelligibility score or aggregate clarity/intelligibility score for at least one audio channel.

Determining the individual clarity/intelligibility score for each clarity/intelligibility-affecting parameter may be performed before and after performing the clarity/intelligibility enhancement.

Determining an individual clarity/intelligibility score may include assigning a score to each clarity/intelligibility-affecting parameter based on experiential rankings of a plurality of pre-recorded audio segments having varied audio characteristics.

The experiential rankings may indicate perceived voice clarity and speech intelligibility of the each pre-recorded audio segment.

Combining the individual clarity/intelligibility scores to generate an aggregate clarity/intelligibility score may include calculating a weighted aggregate clarity/intelligibility score; calculating a minimum aggregate clarity/intelligibility score; and combining the weighted aggregate clarity/intelligibility score and the minimum aggregate clarity/intelligibility score. Calculating the weighted aggregate clarity/intelligibility score may include determining, based on the experiential rankings, a weighting factor for each clarity/intelligibility-affecting parameter; and multiplying the weighting factor by the individual clarity/intelligibility score.

The custom DSP chain may include at least one monitoring DSP and at least one enhancement DSP, and may include at least one of a music detector, a volume meter, a noise floor detector, a clipping detector, a noise gate, a de-noiser, and an automatic gain controller (AGC).

The number of DSPs in the custom DSP chain may be variable. Moreover, the method may include selecting an order of DSPs in the custom DSP chain based on TSI conditions.

The method may further include detecting that a new participant has joined a TSI in progress; separating out audio of the new participant; and generating a new audio channel for processing the audio for the new participant. A different set of custom DSPs may be selected to monitor and process the new audio channel.

According to some aspects of the disclosure, the custom DSP chain may include a first DSP configured to receive the original audio and subsequent DSPs, each subsequent DSP configured to receive an output from the preceding DSP.

According to some aspects of the disclosure, at least one DSP in the custom DSP chain is a software-based DSP.

The method may further include detecting a change in a first individual audio channel related to a behavior of a DSP applied in a second individual audio channel and reconfiguring the custom DSP chain for the individual audio channel or the second individual audio channel.

The method may further include detecting a factor causing audio signal degradation on at least one individual audio channel and reconfiguring the custom DSP chain for the at least one audio chain to overcome the factor.

Additional features, advantages, and embodiments of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced.

DETAILED DESCRIPTION OF THE DISCLOSURE

Figure 1:
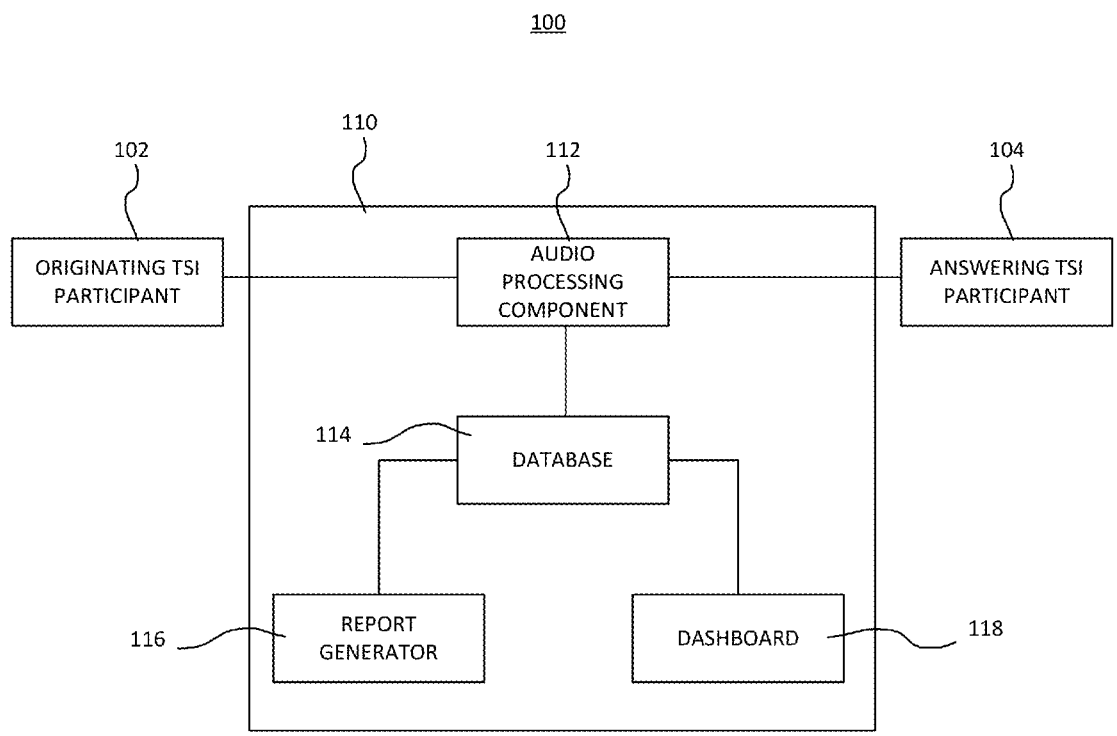
FIG. 1 illustrates an example of a system for measuring and improving voice clarity and speech intelligibility.

The embodiments of the disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure, which is defined solely by the appended claims and applicable law. Moreover, it is noted that like reference numerals represent similar parts throughout the several views of the drawings.

Systems, methods and apparatus are described herein for continuously measuring voice clarity and speech intelligibility by evaluating a plurality of telecommunications channels in real time. Voice clarity and speech intelligibility measurements may be formed from chained, configurable software-based DSPs that can be added, subtracted, reordered, or configured to target specific audio features. Voice clarity and speech intelligibility may be enhanced by altering the media in one or more of the plurality of telecommunications channels. Analytics describing the measurements and enhancements may be displayed in reports, or in real time via a dashboard.

FIG. 1 shows an example of a system 100 that is constructed according to principles of the disclosure. The system 100 may be configured to measure and improve voice clarity and/or speech intelligibility in real- or near real-time. Interactions between an originating TSI participant 102 and an answering TSI participant (e.g. a contact center agent) 104 may be processed via a voice clarity measurement and enhancement (VCME) system 110. While interaction between one originating TSI participant and one answering TSI participant is shown in FIG. 1, this is merely an example. The principles described herein are equally applicable to other types of TSIs, including conference calls involving multiple call participants and telecommunication interactions outside a contact center setting.

One or more components of the VCME system 110 may be implemented in a hosted network environment. Thus, while not shown in FIG. 1, an originating TSI participant 102 and an answering TSI participant 104 may communicate over a network, such as a public switched telephone network (PSTN), an internet protocol (IP)-based network, cellular network, and/or any other type of communication network. VCME system 110 may include an audio processing component 112 that facilitates one or more of the detection, measurement, and improvement of voice clarity or speech intelligibility issues. As described in more detail herein, the audio processing component 112 may be configured to separate audio from an originating TSI participant 102 and an answering TSI participant 104 into distinct audio channels for processing. Data collected by VCME 110, describing the clarity/intelligibility measurements and enhancements, including background noise measurement data, volume measurement data, auto-gain control (AGC) statistics data, audio clipping statistics data, and de-noiser improvement statistics data may be stored in database 114. The stored values may be used in calculating an audio score for the original source audio (pre-processing audio), as well as the resulting treated audio (or post-processing audio). The audio score may be displayed or otherwise manifested (e.g., spoken, presented in Braille, or the like) to a systems administrator or other interested party.

For instance, the data collected may be used by the report generator 116 to generate reports reflecting the collected data, including the audio score. The data may be presented via a user interface, such as, e.g., a graphic user interface (GUI), a human user interface (HUI), or the like. The report generator 116 may generate and forward a report data signal to the real-time dashboard 118, which may display the audio score on a display device (not shown), such as, e.g., a display monitor, an image projector, or the like. The dashboard 118 may be configured to present visualizations representing enterprise-wide performance, or to focus on individual TSI paths, destinations, or participant types (e.g. mobile-to-mobile TSIs, TSI participant geographies, or contact center agents).

Figure 2:
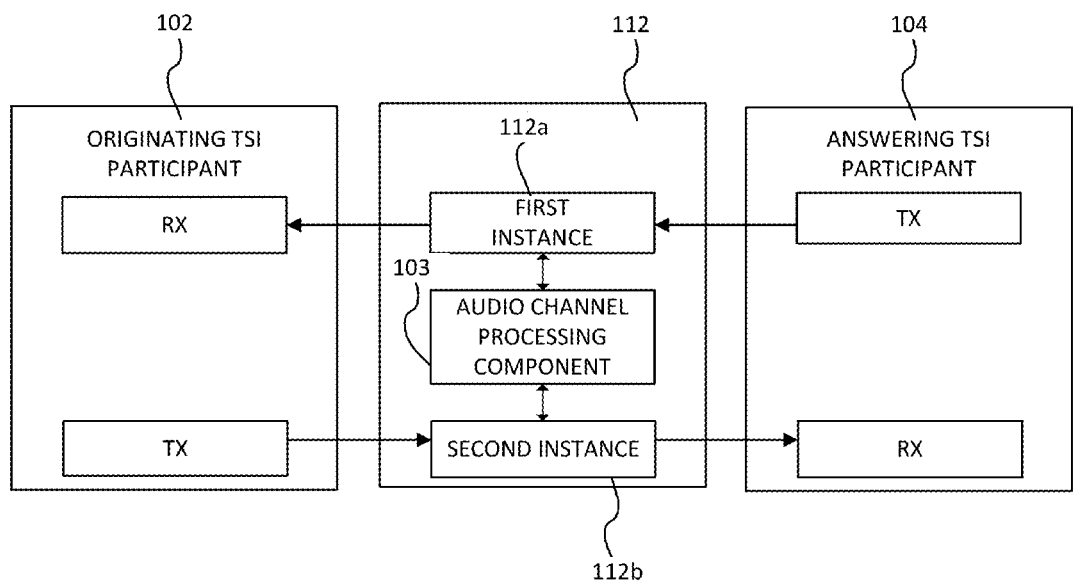
FIG. 2 illustrates another view of the system for measuring and improving voice clarity and speech intelligibility shown in FIG. 1.

As shown in FIG. 2, the audio processing component (APC) 112 may be configured to process a telecommunication system interaction by separating the audio components into separate audio channels. A first instance 112*a* of audio processing component 112 may be configured to process audio transmitted from an answering TSI participant 104 to an originating TSI participant 102. A second instance 112*b* of audio processing component 112 may be configured to process audio transmitted from an originating TSI participant 102 to an answering TSI participant 104.

In accordance with some aspects of the disclosure, APC 112 may include an audio channel processing component 103 that may be configured to detect changes in a TSI participant audio signal that may be related to the behavior of a DSP applied to another TSI participant audio signal. If the detected changes are undesirable, the channel comparison component 103 may trigger a dynamic activation or reconfiguration of certain DSPs to automatically correct the audio signal. For example, the increased gain on one participant audio signal, such as, a participant audio signal being processed by first instance 112*a*, may be determined to trigger an undesirable increase in the speaking volume of a second participant audio signal, such as the participant audio segment being processed by second instance 112*b*. In this case, the audio channel processing component 103 may either trigger a reduction of the gain applied to the first TSI participant, or attenuation of the volume of the second TSI participant, depending on the desired volume levels. In accordance with some aspects of the disclosure, historical comparison information may be used to train audio channel processing component 103 to improve cross channel evaluation. For example, audio channel processing component 103 may implement artificial intelligence (AI) such as an expert system, a neural network, fuzzy logic, and the like.

Audio channel processing component 103 may also be configured to detect environmental or device issues that may cause an audio signal to be considered poor enough to warrant dynamically activating or reconfiguring certain DSPs in the processing chain to automatically remediate detected voice clarity or speech intelligibility issues. For example, audio clipping detected by a clipping detector DSP may influence the level of gain applied by an AGC DSP. Accordingly, the audio channel processing component 103 may be configured to trigger a change in the level of gain applied by the AGC as a result of the detected clipping. As another example, if, during an interaction, noise volume exceeding a configurable threshold is consistently present, a noise gate, when set at a level below the threshold, would remain disengaged, making comfort noise redundant. Audio channel processing component 103 may be configured to lower the volume of comfort noise or disable a comfort noise DSP for that interaction entirely.

The APC 112 includes a plurality of dedicated software digital signal processors (DSPs), each of which may be chained together in a sequential order. Some or all of the DSPs may also be selectively connected in parallel, as the skilled artisan will recognize and understand, consistent with the principles of the instant disclosure. According to one embodiment, a first DSP in the APC 112 may receive an audio stream from a source (e.g., originating TSI participant 102 or answering TSI participant 104 in FIG. 1). Then, each subsequent DSP that is selectively selected may receive the audio signal from the DSP that precedes it. The DSPs may be selected based on, e.g., the attributes of the audio signal. Depending on the nature of the DSP, the audio signal may pass through the DSP unchanged or it may be modified.

Figure 3:
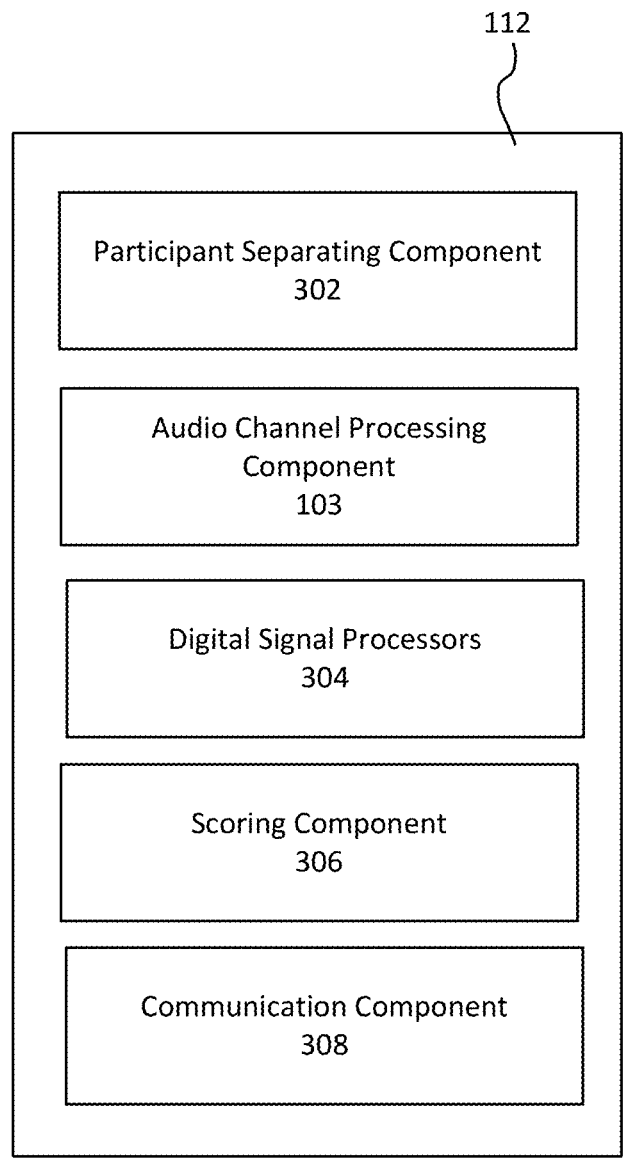
FIG. 3 illustrates an example of an audio processing component.

FIG. 3 shows an example of the audio processing component (APC) 112 constructed in accordance with the principles of the disclosure. Audio processing component 112 may comprise one or more computer/server/processing devices, and may include a computer-readable medium comprising a computer program that may be executed to carry out the processes disclosed herein. The computer-readable medium may include code sections or segments for performing the steps of the processes described herein. The audio processing component 112 may include a participant separating component 302, audio channel processing component 103 (described above with respect to FIG. 2), one or more digital signal processors (DSPs) 304, a scoring component 306, and a communication component 308.

The participant separating component 302 may be configured to receive an incoming telecommunication system interaction audio signal and separate the received audio signal into separate audio channels by participant. By separating the participant audio signals (e.g., originating participant audio signal and receiving participant audio signal) prior to evaluating the voice clarity and/or speech intelligibility, the source of the voice clarity and speech intelligibility issues may be more readily identified. Participant separating component 302 may separate the audio signal and feed the audio signal to the separate audio channels, which may then be fed to one or more DSPs 304. Audio channel processing component 103, as described above with respect to FIG. 2, may be configured to detect changes in a TSI participant audio signal that may be related to the behavior of a DSP applied to another TSI participant audio signal, and to detect environmental or device issues that may cause an audio signal to be considered poor enough to warrant dynamically activating or reconfiguring certain DSPs in the processing chain to automatically remediate detected voice clarity or speech intelligibility issues.

Individual DSPs may be provided to measure and address specific aspects of an interaction's audio signal. For example, a separate DSP 304 may be provided for addressing each clarity/intelligibility affecting parameters including, for example, echo, noise, gain, audio clipping, and noise gating, among other parameters. By providing separate software-based DSPs to address separate voice clarity and/or speech intelligibility issues, processes to treat emerging voice clarity and/or speech intelligibility elements, or revised processes for treating known issues, can be added or swapped. The DSPs 304 may be selected and/or adjusted in real-time (or near-real-time) based on need on a per interaction basis. For example, DSP behavior can be different for different classes of human interaction participants than for a call to an interactive voice response (IVR) system.

In accordance with some principles of the disclosure, a different DSP chain, or a chain with different DSP settings, may be applied to individual channels based, for example, on whether an interaction involves strictly two parties or a multitude of parties as in a conference call. DSP configurations may be tailored to different classes of TSI participants (e.g. contact center agents, geographic locations, mobile phone users . . . ), telephony applications, or other uses.

DSPs 304 may be configured to determine the presence of one or more voice clarity and/or speech intelligibility affecting parameters, such as echo, noise, gain, volume, clipping, and noise gating, and to perform one or more enhancement steps as needed. DSPs 304 may be further configured to provide an audio score for a given audio stream based on the particular characteristic that it evaluates. For example, a gain DSP may be configured to render a gain level from, e.g., "0" to "4," with "1" indicating unity gain. Variance from the unity gain may indicate that a reduction or increase in amplitude is required. Other DSPs may be configured to use different units and scales.

DSPs 304 may compute an audio score both before and after signal enhancements. DSPs 304 may be configured to begin rescoring each audio path whenever a new TSI leg starts. For example, if a two-party TSI is transferred to a third party (e.g. a contact center escalation), the DSPs 304 may be configured to begin rescoring the new, transferred audio paths.

In accordance with principles of the disclosure, the DSPs 304 may be configured to detect environmental or device issues that may cause an audio signal to be damaged beyond repair. For example, clipping or extreme noise may be detected and reported to an enterprise system administrator or other interested user for addressing such issues.

Scoring component 306 may be configured to receive the individual DSP measurements and to calculate individual audio characteristic scores and an aggregate audio score for the associated audio signal. Scoring component 306 may be configured to receive the individual DSP measurements both before and after enhancement, and to compute an aggregate audio score both before and after enhancement. The difference between the pre- and post-enhancement audio scores may indicate the degree to which voice clarity and speech intelligibility has been improved. According to some aspects of the disclosure, the scoring component 306 may include artificial intelligence (AI), such as, an expert system, a neural network, fuzzy logic, and the like. In this regard, historical scoring information may be used to train the components to improve scoring.

The scoring component 306 may be configured to compute a score that is biased toward one or more elements. For example, factors such as volume, noise, and the relationship between volume and noise often have the strongest effect on speech intelligibility. As such, these factors may be given more weight. While the score may also reflect other factors, such as clipping and low frequency noise, such factors may be weighted less heavily.

Communication component 308 may be configured to facilitate communication of collected parameters and computed audio scores over a network. In accordance with aspects of the disclosure, TSIs may be treated in a centralized manner, avoiding the need to deploy dedicated echo cancellers and/or other clarity detecting/correcting devices throughout the network.

In accordance with some aspects of the disclosure, if a significant negative shift in audio scores is noticed, the system may engage a network recording service (not shown) on a dynamic basis to preserve the audio for human analysis.

Figure 4:
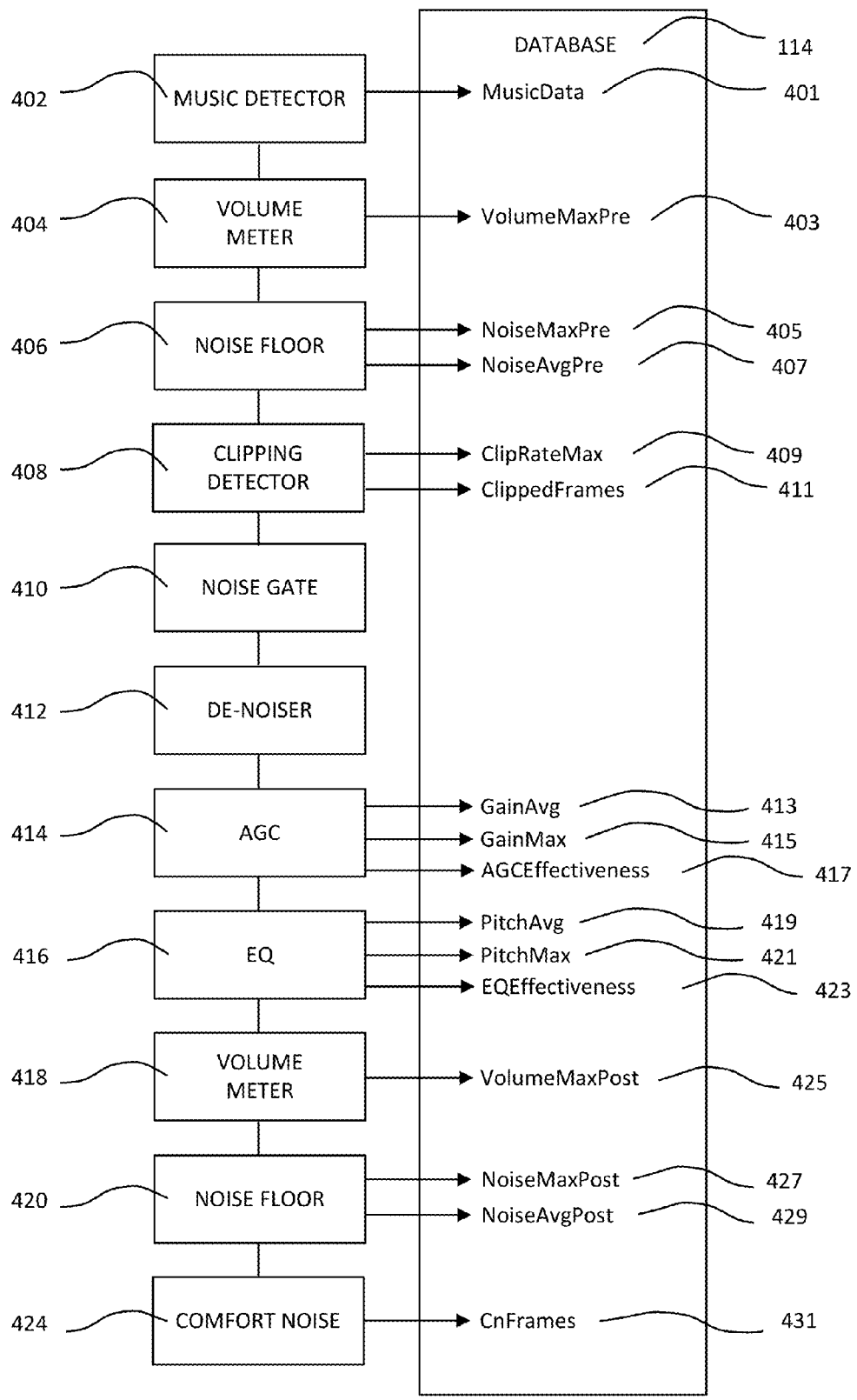
FIG. 4 illustrates an example of a plurality of digital signal processors that may be used in measuring and improving voice clarity and speech intelligibility.

FIG. 4 illustrates an example of a plurality of DSPs for processing a TSI participant channel. One or more of the DSPs may store measurement data in database 114.

A music detector DSP 402 may be configured to monitor an audio stream from the answering TSI participant (or originating TSI participant) for the presence of music. The music detector DSP 402, when it detects the presence of music in the audio stream, may output a music detector result 608 (shown in FIG. 6), to be interpreted by other DSPs, as well as a music data signal 401, which may include, e.g., a music yes/no state signal, a start and stop time stamp for the music signal, one or more characteristics of the music signal (e.g., an amplitude, a pitch, a tempo, or the like), or substantially only the music signal, which may be a replica of the music signal in the audio stream. The music detector result 608 may be used by subsequent DSPs to process and modify attributes of the audio signal. The music data signal 401, that may be stored in database 114, may be beneficial in detecting and monitoring the presence of music in an audio signal, e.g., the playing of hold music during a contact center call.

A pre-enhancement volume meter 404 may be provided to track the maximum volume (e.g., in decibel units—i.e., dB) of the audio stream over the life of the TSI. The pre-enhancement volume meter 404 may be configured to measure the peak amplitude of each frame, tracking the peak frame amplitude as part of its state. The pre-enhancement volume meter may output a variable VolumeMaxPre data signal 403 that may be stored in database 114. The pre-enhancement volume meter 404 may include a measurement DSP that does not alter the audio it receives as input.

A pre-enhancement noise floor DSP 406 may be provided for identifying and tracking the amount of background noise prior to processing of the audio signal. This pre-enhancement noise floor DSP 406 may be configured to measure the per-frame amplitude in order to track ambient background noise in the source audio signal. The background noise level may ramp up slowly and ramp down quickly to prevent lengthy bursts of speech from impacting the perceived noise level.

Pre-enhancement noise floor DSP 406 may output a variable NoiseMaxPre data signal 405 representing its measurement of the maximum noise volume. Pre-enhancement noise floor DSP 406 may output a variable NoiseAvgPre data signal 407 representing its measurement of the average noise volume. The pre-enhancement noise floor DSP 406 may be configured to not take measurements when the music detector 402 sends a music detector result 608 that indicates that music is present (e.g., a music "yes" state signal). The pre-enhancement noise floor DSP 406 may include a measurement DSP that does not alter the audio it receives as input.

Clipping detector 408 may be provided for monitoring the audio stream for clipped audio. The clipping detector 408 may include a DSP that does not correct clipping issues, but, instead, leaves the audio signal received at the audio input unchanged. Clipping detector 408 may output a ClipRateMax data signal 409 and a ClippedFrames data signal 411. Clipping detector 408 may monitor peak samples at each frame, monitoring for clipped sequences that exceed a predetermined minimum length. Both ClipRateMax data signal 409 and ClippedFrames data signal 411 may be stored in the database 114.

According to some aspects of the disclosure, the DSPs within audio processing component 112 (shown in FIG. 1) may be configured to naturally process 16-bit linear values. However, the audio may be sourced from, e.g., a PSTN connection utilizing 8-bit μ-law. The audio processing component 112 may be configured to process other sample rates, such as, e.g., 16 kHz, 48 kHz, and the like, without departing from the scope or spirit of the disclosure. Consequently, the levels used for clipping limits may vary. The audio processing component can also process different sample sizes such as 16-bit or 32-bit, either integer or floating point. Clipping detector 408 may receive notification of the source audio type, or may be configured to automatically determine the audio source by assuming μ-law levels until values outside of the μ-law limits are encountered.

Noise gate DSP 410 may be configured to shut off, mute, or attenuate the volume of the audio stream when the volume signal is detected to be below a dynamically computed threshold. For instance, the noise gate 410 may be configured to mute or attenuate audio during periods of non-speech to eliminate the distraction of background noise.

De-noiser DSP 412 may be configured to remove certain types of noise from the audio stream. For example, de-noiser 412 may be configured to detect hiss and/or static in an audio stream, and to remove such noise from the audio stream.

Automatic gain control (AGC) DSP 414 may be configured to dynamically adjust the gain of the audio signal to raise or lower the gain to a desired target level. For example, the gain may be adjusted to match a target level. Adjusting the gain may be used to compensate, for example, for poorly adjusted headset microphones or connections having gain losses. The AGC DSP 414 measures the volume in speech frames. The AGC 414 may receive a music detector result 608 from the music detector and adjust the gain of the audio signal based on the presence or absence of music in the audio. Outputs of the AGC DSP 414 may include AGC measurement data, including average gain (GainAvg) data 413, maximum gain (GainMax) data 415, and gain effectiveness (AGCEffectiveness) data 417, all of which may be sent to and stored in the database 114.

Audio equalization (EQ) DSP 416 may be configured to dynamically adjust the gain of the audio signal, raising or lowering the gain of a certain frequency or range of frequencies to a desired target level. For example, audio equalization may be adjusted to emphasize higher audible frequencies. Enhancing the perceptibility of higher frequencies may be used to improve a participant's ability to hear consonant sounds, which contribute to the intelligibility of speech. The EQ 416 evaluates the frequency spectrum in speech frames. The EQ 416 may receive a detector result 608 from the music detector and adjust its behavior based on the presence or absence of music in the audio. Outputs of the EQ 416 may include EQ measurement data, including average pitch (PitchAvg) data 419, maximum pitch (PitchMax) data 421, and equalization effectiveness (EQEffectiveness) data 423, all of which may be sent to and stored in the database 114.

A post-enhancement volume meter DSP 418 may be provided. The post-enhancement volume meter DSP 418 may measure the peak volume (e.g., in dB) of the audio stream after the enhancement DSPs have processed the source audio signal. The post-enhancement volume meter DSP 418 may output a VolumeMaxPost data signal 425 to the database 114.

Similarly, a post-enhancement noise floor DSP 420 may be provided to measure the amount of background noise after the enhancement DSPs have processed the audio signal. The post-enhancement noise floor DSP 420 may output NoiseMaxPost data 427. Post-enhancement noise floor DSP 420 may output a variable NoiseAvgPost data signal 429 representing its measurement of the average noise volume. Both of these values may be written to the database 114. Post-enhancement volume meter 418 and post-enchantment noise floor DSP 420 work in a manner similar to their pre-enhancement counterparts.

Comfort Noise (CN) DSP 424 may be configured to dynamically introduce pink noise into the audio signal when the volume of the audio stream falls below configured levels. For example, pink noise may be introduced into a conference call when all participants cease speaking A small, but perceptible amount of noise is used to subtly reassure all call participants that all call participant channels are still active (i.e. the call hasn't disconnected). Outputs of the CN 424 may include comfort noise application data, including comfort noise frames (CnFrames) 431, which may be sent to and stored in the database 114.

While the example in FIG. 4 was described with regard to monitoring and processing of the source audio stream in the answering TSI participant channel, the description applies equally to monitoring and processing of the source audio stream in the originating TSI participant channel. The system may include substantially the same components, configured in substantially the same way as the components in FIG. 4 to monitor and process the source audio stream in the originating TSI participant channel.

Figure 5A:
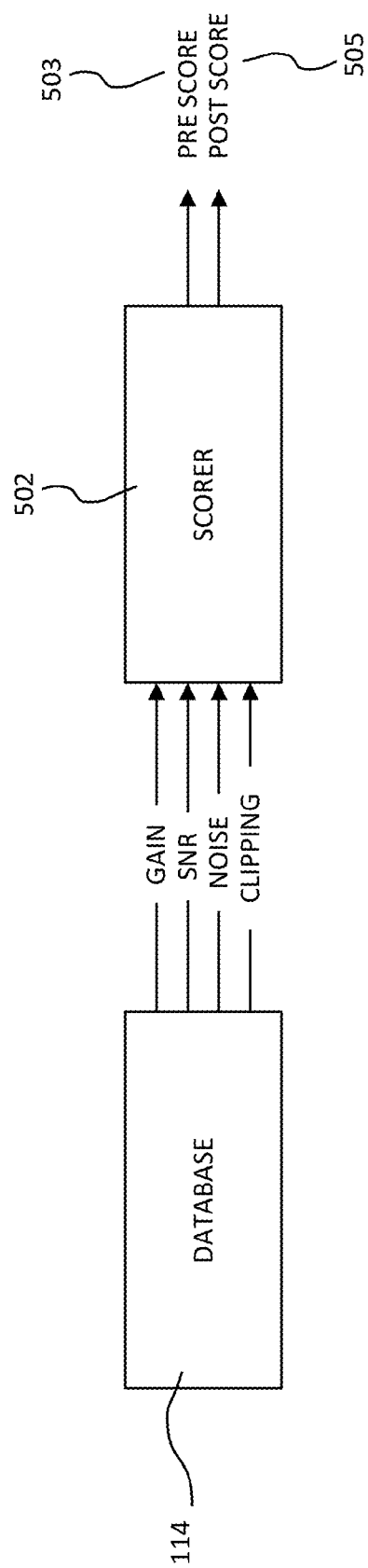
FIG. 5A is a high-level flow chart illustrating an example of a method for generating clarity/intelligibility scores.

Turning now to FIG. 5A, an example of a method of generating clarity/intelligibility scores is illustrated. As described above, database 114 may be configured to store values measured by one or more DSPs. A scorer 502, which may be implemented in the scoring component 306, may be configured to retrieve data from database 114 to calculate and output pre-enhancement audio scores 503 and post-enhancement audio scores 505. The scorer 502 may be biased towards one or more factors. For example, factors such as volume, noise, and the relationship between volume and noise often have the strongest effect on speech intelligibility. As such, the scorer 502 may be biased to give more weight to those factors. While the audio score may also reflect other factors, such as clipping and low frequency noise, such factors may be weighted less heavily.

Figure 5B:
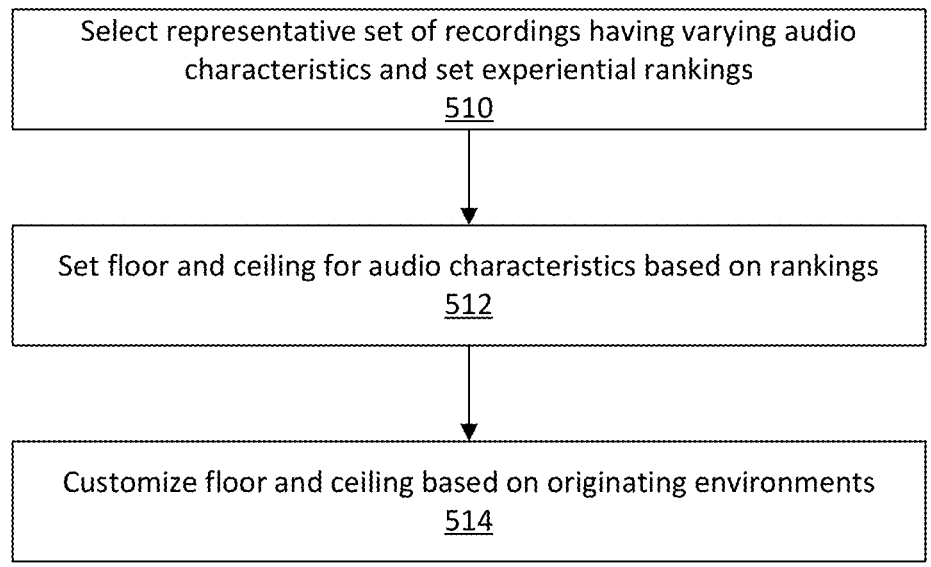
FIGS. 5B and 5C are flow charts illustrating additional aspects of a method for generating clarity/intelligibility scores.

Scorer 502 may be configured to determine floor and ceiling thresholds for each audio characteristic contributing to voice clarity and speech intelligibility. The floor and ceiling thresholds may be used to generate individual and aggregate scores in real-time (or near-real time) for an audio signal being evaluated. FIG. 5B illustrates an example of a method that may be implemented by scorer 502 to determine the floor and ceiling thresholds in advance of the real time (or near real time) processing of an audio channel. As shown at 510, the scorer 502 selects a representative set of recordings having varying audio characteristics. For example, a set of full recordings of actual calls or recording segments having widely varying audio characteristics, including volume, noise, clipping, echo, mobile phone network transmission artifacts (e.g., drop outs, distortion, compression, etc.), voice over IP (VoIP) network transmission artifacts (e.g., drop outs, distortion, compression, etc.), and/or other audio characteristics may be selected. An experiential ranking may be applied to each of the selected recordings, the experiential ranking indicating the perceived voice clarity and speech intelligibility. For example, a 1-10 ranking scale or any other ranking method may be used. The experiential ranking may be based, for example, on well-known audio path norms, feedback received from reviewers who listen to and rank the recordings, etc.

As shown at 512, the scorer 502 sets a floor and/or ceiling value for each audio characteristic contributing to voice clarity and speech intelligibility based on the experiential rankings. The scorer may examine the experiential rankings, along with the DSP measurements for the audio characteristics for each representative recording, to determine, for each audio characteristic, the floor and ceiling thresholds. For example, based on the rankings, the scorer 502 may determine that clarity is best when the maximum noise is at or below a certain level and worst when the max noise is at another level based on the experiential rankings.

The originating environment for a call may affect its score. As shown at 514, the floor and ceiling values for audio characteristics may be customized based on originating environment. For example, if a large portion of the recorded audio segments are calls that took place in an extremely noisy call center, the noise scale may be adjusted upward to provide an additional spread of scores across the call base. As another example, if a call center used high quality equipment and had well trained agents, the representative recordings may show very little clipping. Accordingly, clipping may be factored out of the scoring, giving more weight to other factors.

Figure 5C:
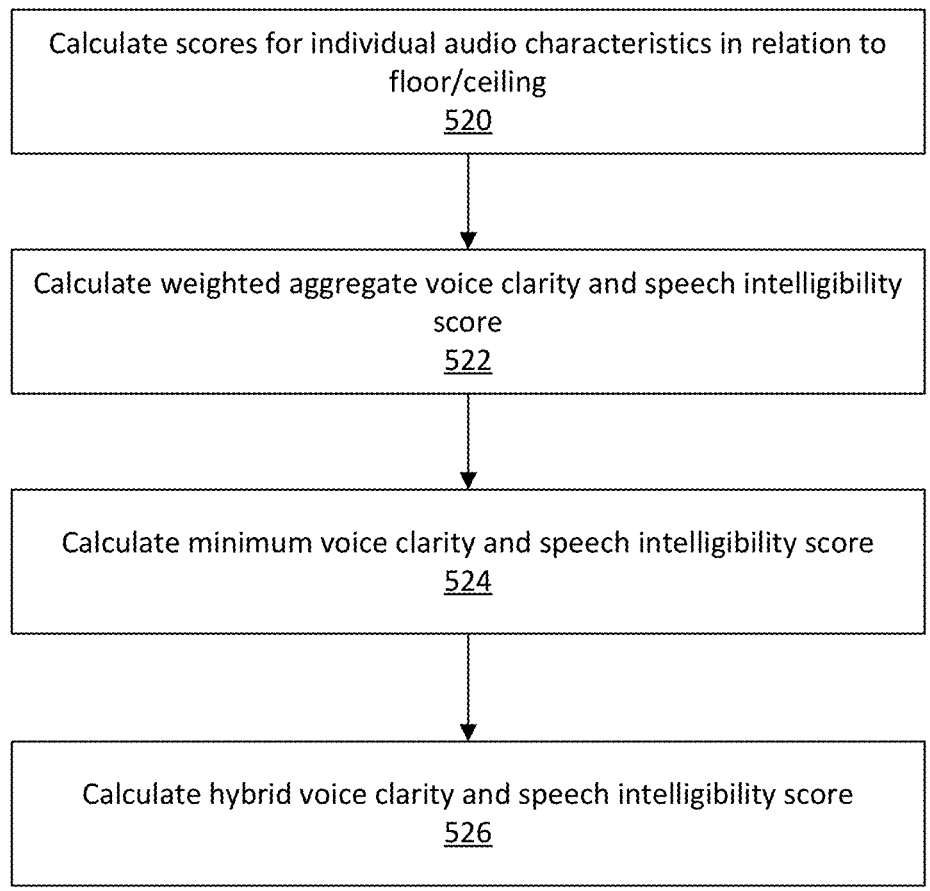

FIG. 5C illustrates an example of a method for calculating real (or near-real) time scores for an audio signal. As shown at 520, scores may be calculated for individual audio characteristics in relation to the floor and/or ceiling. A score between 0 and 1, with 0 being worst and 1 being best, may be calculated for gain, noise, signal-to-noise ratio, clipping, and/or other audio characteristics for an audio signal. Other scoring scales may also be used. The score may be determined by comparing the DSP measurements for the audio characteristics to the designated floor and ceiling for the audio characteristic. The score indicates where the DSP measurements for the audio characteristic fall between the floor and the ceiling.

As shown at 522, the individual audio characteristic scores may be blended to generate a weighted aggregate voice clarity and speech intelligibility score. A weighted score may be calculated that applies different weights to each audio characteristic based on the experiential rankings. The scorer may refer to the experiential audio characteristic rankings and may determine a weighting factor to be applied to each audio characteristic based on the presence of each audio characteristic in the recorded segment. These percentages may then be multiplied by the individual audio characteristic score from a real-time interaction as determined in step 520.

As shown at 524, a minimum score may also be calculated that evaluates the audio according to its worst individual characteristic. The weighted aggregate score and the minimum score may be combined to generate a hybrid aggregate score, as shown at 526. For example, if an audio signal being evaluated has noise as its lowest score, the noise score would be combined with the weighted aggregate score to generate the hybrid aggregate score. According to some aspects of the disclosure, a separate weighting factor may be applied to each of the weighted aggregate score and the minimum score prior to combining the values.

Figure 6:
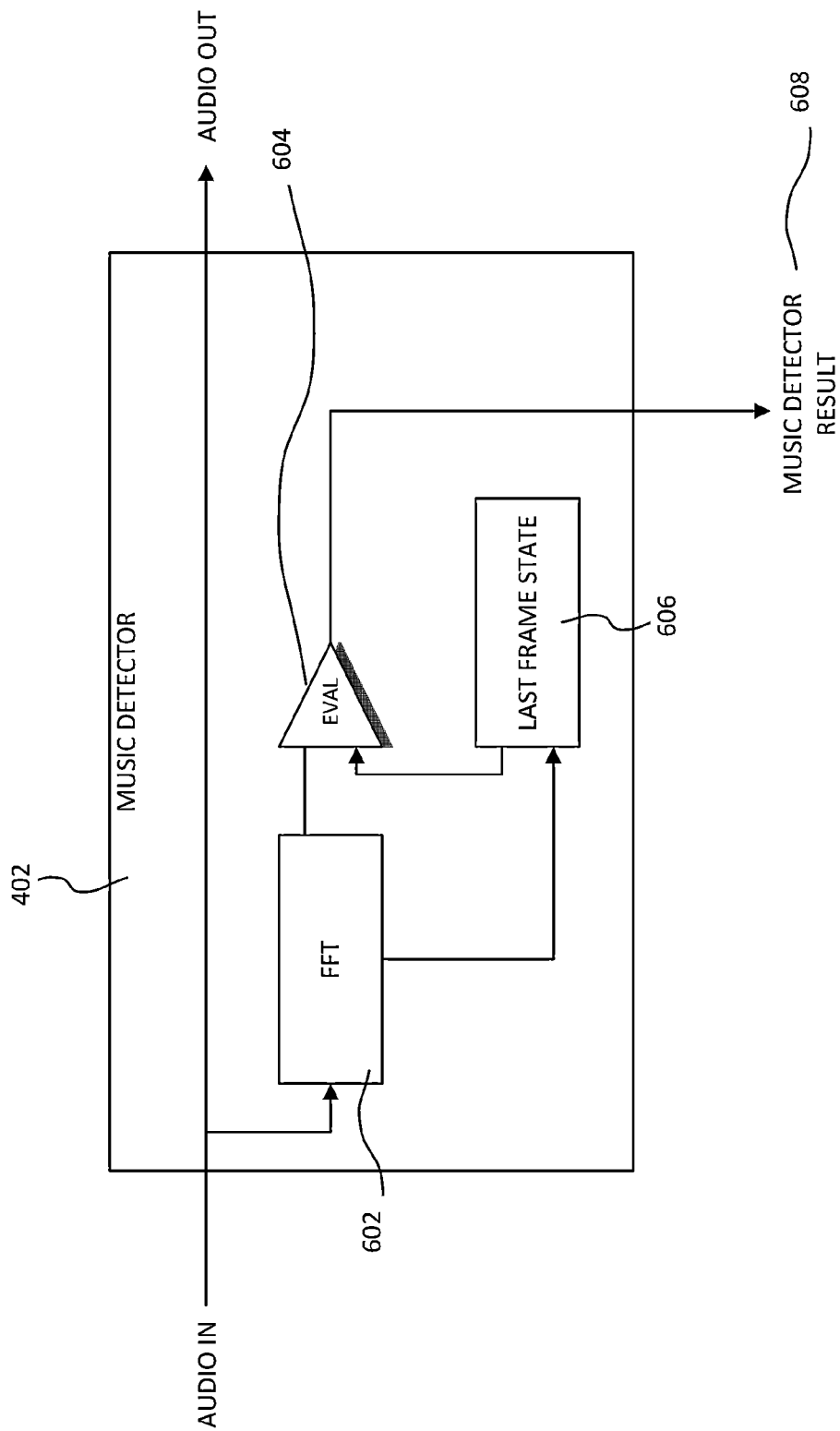
FIG. 6 is a block diagram illustrating an example of a music detector DSP.

FIG. 6 illustrates an example of a music detector 402. As described above, the music detector 402 may be used when processing originating or answering participant audio streams. Music detector 402 may receive an audio input, and a Fast Fourier Transform (FFT) 602 may be performed on the input audio signal. The music detector 402 may continuously monitor the audio stream for the presence of music. Accordingly, the FFT value of the previous frame 606 is stored. Evaluator 604 compares the FFT value of the current frame of the input audio signal to the stored value of the previous frame, looking for small changes in the overall state of the FFT. Such small changes are more commonly found in music than the rapid multiband fluctuations found in speech. The result of the evaluator may be output and stored as music detector result 608. This variable may be used by other DSPs that need to determine whether music is present.

Figure 7:
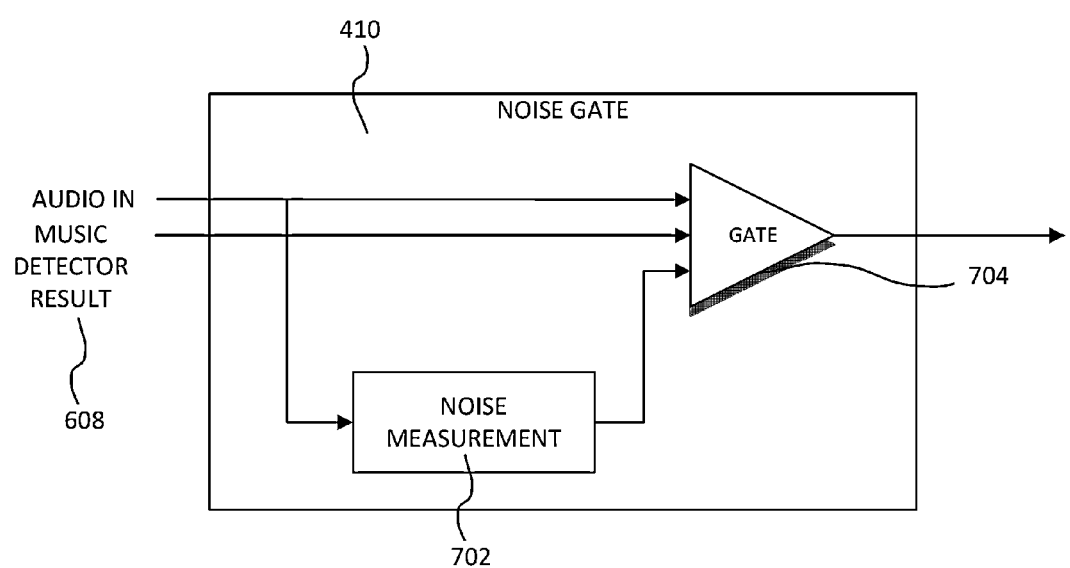
FIG. 7 is a block diagram illustrating an example of a noise gate DSP.

Turning now to FIG. 7, an example of the noise gate DSP 410 is shown. As described above, noise gate 410 may be configured to mute or attenuate channel audio during periods of non-speech to eliminate the distraction of background noise. The amount of noise present in the audio input stream is measured, as shown at 702. This measurement may be performed, for example, by noise floor DSP 406. Gate 704 receives as input the audio input stream, music detector result 608, and the background noise measurement level 702. Audio that is above the background noise level by a given amount is considered speech, deactivating gate 704. Audio beneath this level is considered non-speech, at which point the gate 704 becomes active. Gate transitions may vary depending upon the direction. For example, the time required for transitioning from muted or attenuated to unmuted may be different from the time required for transitioning from unmuted to muted or attenuated audio.

Figure 8:
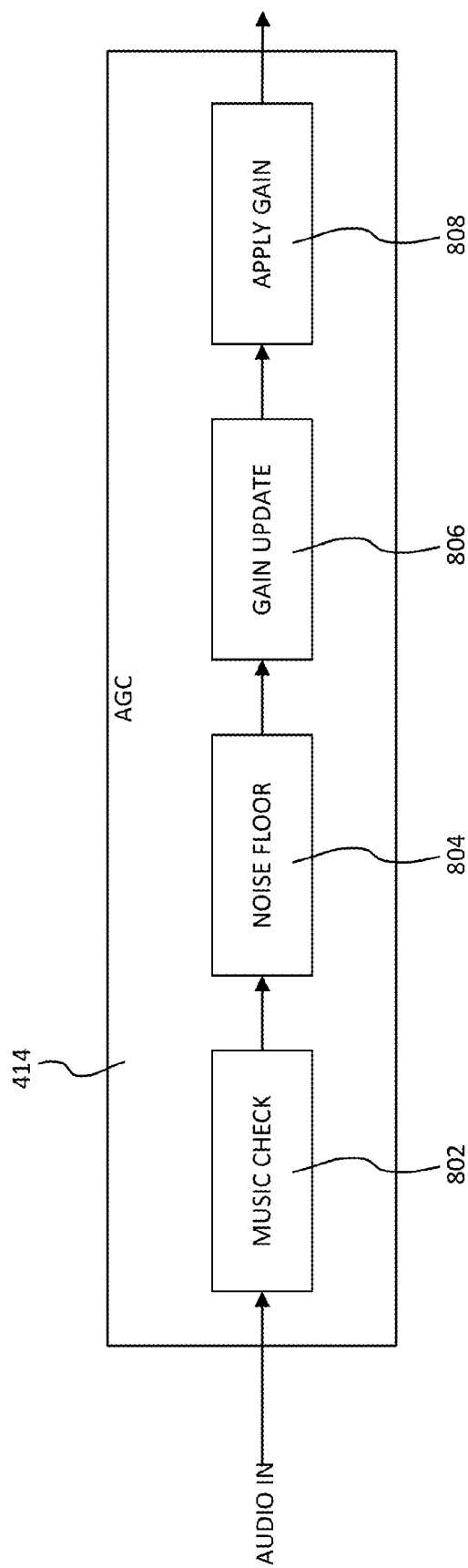
FIG. 8 is a diagram illustrating an example of a method implemented by an automatic gain control (AGC) DSP.

FIG. 8 illustrates an example of AGC DSP 414 in greater detail. The AGC DSP 414 may be configured to measure the volume of speech frames, as indicated by the music detector, and to raise or lower the gain applied to the input audio signal to match a target level. The AGC 414 receives an input audio signal and performs a music check, as shown at 802. This may include, for example, querying music detector 402 or using an internal music detector. The music state may be updated accordingly for use in later stages.

As shown at 804, noise floor measurements may be obtained. For example, the AGC may retrieve the noise floor measurements performed by noise floor DSP 406, or it may perform similar calculations independently.

A gain update may be performed, as shown at 806, by applying a gain delta value calculated during a prior update. This may cause the gain to transition to new values by, e.g., ramping the gain smoothly. If the amplitude of the current frame is greater than the noise floor by a given threshold, and if the frame is not perceived to be music, the frame amplitude may be compared to the tracked peak level and to the current clip level. If the frame amplitude exceeds the currently tracked peak level, the peak level may be updated. Additionally, if the frame amplitude exceeds the current upper limit (clip level), the gain value may be instantly recomputed to accommodate the current frame's amplitude without clipping. If sufficient frames have been examined, a new gain value may be computed based on the peak level seen since the last update. A gain delta value applied at each frame may be computed as the delta frame between the target gain and current gain divided by the number of update frames.

An effective gain statistic (e.g., AGCEffectiveness data signal 417) may be tracked, which represents the ability for the DSP to apply the gain necessary to reach the target level, as shown at 808. In cases where the signal is too weak to reach the target level, for example, where the gain required would exceed the maximum allowed gain, effectiveness may drop to below 100%.

Figure 9:
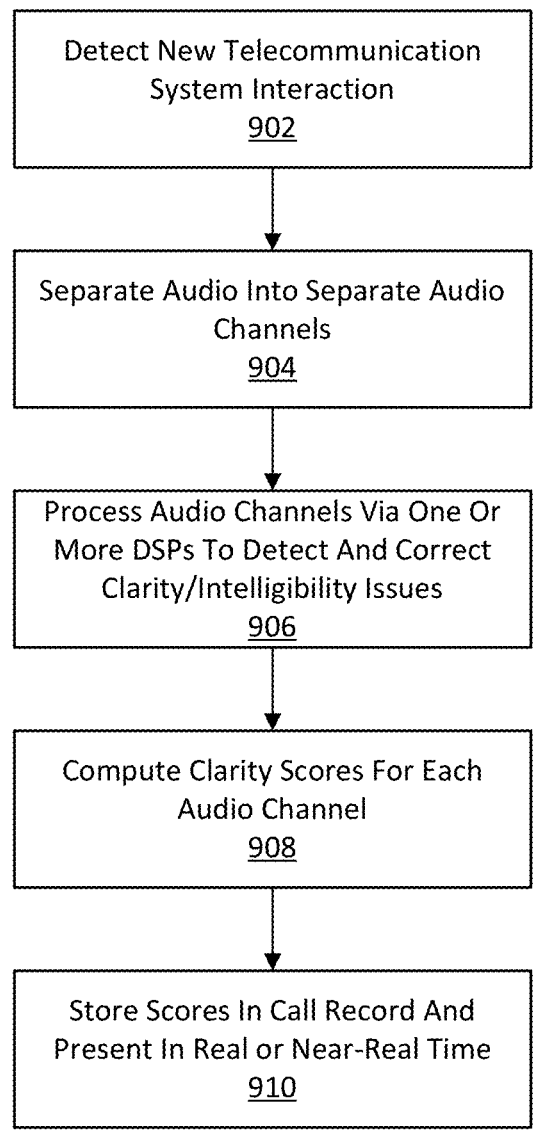
FIG. 9 is a flowchart illustrating an example of a method for measuring and improving voice clarity and speech intelligibility.

FIG. 9 shows a flowchart of an example of a method for measuring and removing voice clarity and/or speech intelligibility defects according to the principles of the disclosure. As shown at 902, a new telecommunication system interaction is detected. The interaction may involve two or more participants. As shown at 904, the audio is separated into separate audio channels by participant. As shown at 906, the separate audio channels are processed by one or more DSPs. The audio channels are processed substantially simultaneously. Each DSP may be configured to detect and correct voice clarity and/or intelligibility defect, such as, e.g., echo, noise, signal clipping, or gain. As seen at 908, individual and aggregate audio scores for each audio channel are computed, both pre- and post-DSP enhancement. As seen at 910, the audio scores may be stored in a detail record and presented near real-time.

Figure 10:
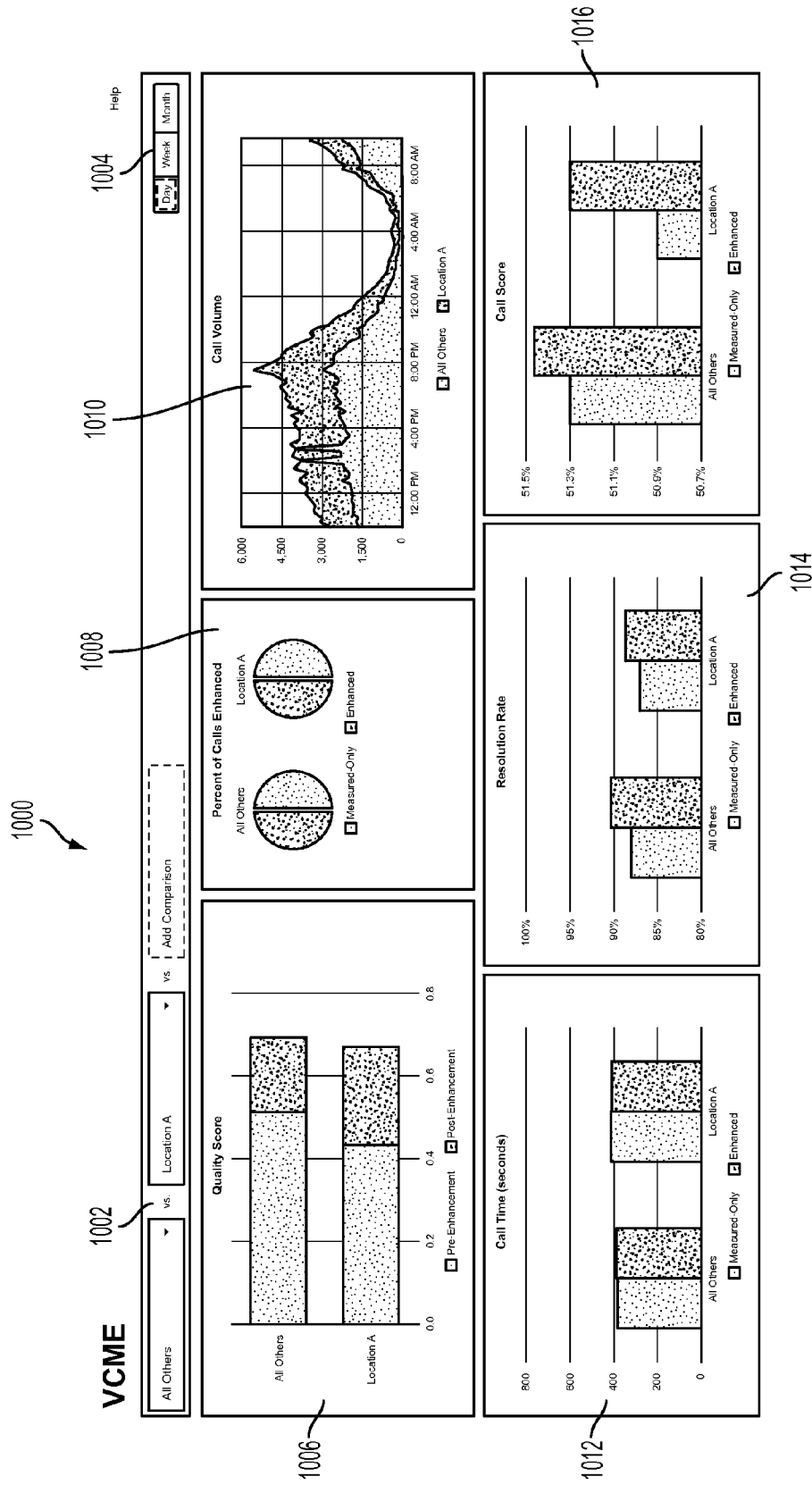
FIG. 10 illustrates an example of a voice clarity and speech intelligibility dashboard display.

FIG. 10 depicts an example of a voice clarity/speech intelligibility dashboard 1100 that may be used to provide real-time or near real-time results representing call quality. While certain data are shown in this example, the disclosure is not so limited. Other types of data may also be displayed. The dashboard 1000 may be configured to display pre- and post-enhancement audio score data, as well as other relevant statistics. As seen in FIG. 10, the audio score data may include, e.g., a quality score, a call time score, a percent of calls enhanced score, a resolution rate score, and an aggregate call score.

Dashboard 1000 may include options that enable a user to have a customized viewing experience. Menu 1002 provides options for showing selected aspects of the measured data. For example, as shown in this example, data representing scores of all monitored calls versus only calls in Location A are shown. Results may be filtered by days, weeks, months, etc., as shown at 1004.

Dashboard element 1006 displays quality scores showing the difference between composite pre-enhancement scores and composite post-enhancement scores. Dashboard element 1108 displays the amount of traffic that is being evaluated and the amount of traffic being enhanced. Dashboard element 1010 displays call distribution among entities at various time frames. Dashboard element 1012 illustrates the efficiency of calls being evaluated versus calls being enhanced. Efficiency may be measured in average total call duration, average call handle time, or using other available statistics. Dashboard element 1014 illustrates the effectiveness of calls being evaluated versus calls being enhanced. Effectiveness may be measured by resolution rate, close rate, and/or other available statistics. Dashboard element 1016 illustrates the caller experience for calls being evaluated versus calls being enhanced. Originating TSI participant experience may be measured by a customer satisfaction score (for example, based on a satisfaction survey administered during or after the call), a quality assurance score, or by some other available statistic. In the example dashboard shown in FIG. 10, originating TSI participant experience is measured using a call score, which represents the degree to which a call matches an ideal call in terms of conversational patterns. While specific dashboard elements are shown in FIG. 10, these are just examples of the type of data that can be displayed. Additional or other dashboard elements may be included.

The measurement of speech intelligibility may be used as a comparative measure of carrier line quality or in the case of a contact center application, private line circuit or network quality. The systems and methods described herein measure aspects of audio that are symptomatic of issues with carrier lines, such as low-level noise (e.g., static, hiss, etc.) and clipping. The algorithms used may be tuned based on interactions with various carriers and endpoints, providing a baseline from which to draw conclusions about the performance of all telephony. The system can graphically display the performance of individual connections, comparing them to other connections of similar type, those common to a specific enterprise, or across all connections to the same system (e.g., a global average). Contact centers, which by their nature may have background noise from agents and steady-state interfering noise from a concentration of fans and convoluted telephony connections, are an example of how the system can be tuned to individual environments. What would be considered a significant line noise issue in a peer-to-peer environment might be the baseline for a contact center environment. The system can be tuned for this difference, and moreover can be tuned for a specific contact center or set of contact centers. These measurements lead to the ability drive underlying carriers to improve performance through the presentation of documented issues. For the contact center, the system alerts management to issues in either the carrier or their internal telephony infrastructure.

Because the aggregate score for audio is built from individual, configurable components, system measurements can be adapted for individual industries based on intelligibility need. For example, in industries where intelligibility may have legal implications (e.g., revealing medical records, delivering a legal ruling, etc.), the system may be configured to provide proof that audio is delivered in a highly intelligible manner in the form of a quality score. In instances where the conditions of audio production are highly predictable, the system can evaluate the qualities of an individual's voice including volume and distribution across the frequency spectrum. This may be useful in the medical industry for evaluating voice performance of those with recovering voices or artificial voice systems. Industries with a strong sales component, like insurance or financial services, where voice impression is a significant component, would also benefit from the ability to measure, and subsequently improve, employee intelligibility.

The enhancement of intelligibility leads to a more efficient exchange of information between the originating TSI participant and answering TSI participant in a contact center scenario, leading to a number of salutary effects for the TSI participants and the enterprise. With less intermediation of noise, less repetition and increased informational throughput, contact center calls can more rapidly address the concerns at hand, reducing the amount of time required to exchange information on each interaction and increasing the quality of information exchange. This reduction of time, and the reduction of frustration due to technological intermediation, leads to increases in both resolution rate and customer satisfaction.

Technologies that process audio benefit from treatment by this DSP technology. Speech recognition and analytics providers see improved recognition rates after audio has been treated for excessive noise and volume normalized by our standard DSP configuration. Dedicated configurations that apply alternate frequency enhancement or filtration DSPs even further improve performance. Recording playback applications for either manual or automated transcription experience similar benefits.

The system provides a reliable, objective audio intelligibility score for a candidate's audio configuration with only seconds of telephony audio. Once hired, employers can perform continual audio intelligibility analysis of employee performance tracked to time, providing a useful, unbiased tool for human resources.

Each DSP provides a wealth of information about certain audio characteristics of the TSI, streamed audio or recording. While the system uses this underlying data to calculate an intelligibility score, this data may be useful to partners for as an input to an analysis beyond the scope of the system, including user context, experience, or history.

DSPs can accentuate areas of the frequency spectrum to provide for the needs of those with hearing loss. Whether due to injury or due to the typical gender-associated loss of response (in high frequencies for males, low frequency for females), the system can alter audio to accommodate for the needs of participants on a per interaction basis at the start of the interaction, or based on a mechanism triggered by the participant or an external party, shifting frequencies from a range at which the participant is deprived to a range at which the participant is sensate. The EQ DSP in particular can also increase volume at selected frequencies, or across the spectrum, to accommodate those with selective frequency hearing loss.

DSPs can affect signal clarity to improve the conveyance of emotional content in interpersonal voice interactions. In telephonic (non face-to-face) communications (e.g. telephone calls) non-verbal signals (e.g. vocal timbre, tone, non-verbal back-channeling . . . ) play an important role in supporting the communication of the intent, emotion and meaning of verbal signals (words). Voice clarity issues impede the transmission of these subtle non-verbals, detracting from the substance, intimacy and power of an interaction. The reduction of noise and selective frequency gain provided by DSPs can serve to improve the conveyance of audible non-verbal signals therefore improving a participant's ability to present the totality of their meaning in interpersonal interactions.

While the disclosure has been described in terms of exemplary embodiments, those skilled in the art will recognize that the disclosure can be practiced with modifications in the spirit and scope of the appended claims. These examples given above are merely illustrative and are not meant to be an exhaustive list of all possible designs, embodiments, applications, or modifications of the disclosure.

A "computer," as used in this disclosure, means any machine, device, circuit, component, or module, or any system of machines, devices, circuits, components, modules, or the like, which are capable of manipulating data according to one or more instructions, such as, for example, without limitation, a processor, a microprocessor, a central processing unit, a general purpose computer, a super computer, a personal computer, a laptop computer, a palmtop computer, a smart phone, a cellular telephone, a tablet, a web-book, a notebook computer, a desktop computer, a workstation computer, a server, a cloud, or the like, or an array of processors, microprocessors, central processing units, general purpose computers, super computers, personal computers, laptop computers, palmtop computers, notebook computers, desktop computers, workstation computers, servers, or the like.

A "database," as used in this disclosure, means any combination of software and/or hardware, including at least one application and/or at least one computer. The database may include a structured collection of records or data organized according to a database model, such as, for example, but not limited to at least one of a relational model, a hierarchical model, a network model or the like. The database may include a database management system application (DBMS) as is known in the art. The at least one application may include, but is not limited to, for example, an application program that can accept connections to service requests from clients by sending back responses to the clients. The database may be configured to run the at least one application, often under heavy workloads, unattended, for extended periods of time with minimal human direction.

A "network," as used in this disclosure, means any combination of software and/or hardware, including any machine, device, circuit, component, or module, or any system of machines, devices, circuits, components, modules, or the like, which are capable of transporting signals from one location to another location, where the signals may comprise information, instructions, data, and the like. A network may include, but is not limited to, for example, at least one of a local area network (LAN), a wide area network (WAN), a metropolitan area network (MAN), a personal area network (PAN), a campus area network, a corporate area network, a global area network (GAN), a broadband area network (BAN), or the like, any of which may be configured to communicate data via a wireless and/or a wired communication medium.

A "server," as used in this disclosure, means any combination of software and/or hardware, including at least one application and/or at least one computer to perform services for connected clients as part of a client-server architecture. The at least one server application may include, but is not limited to, for example, an application program that can accept connections to service requests from clients by sending back responses to the clients. The server may be configured to run the at least one application, often under heavy workloads, unattended, for extended periods of time with minimal human direction. The server may include a plurality of computers configured, with the at least one application being divided among the computers depending upon the workload. For example, under light loading, the at least one application can run on a single computer. However, under heavy loading, multiple computers may be required to run the at least one application. The server, or any of its computers, may also be used as a workstation.

A "communication link," as used in this disclosure, means a wired and/or wireless medium that conveys data or information between at least two points. The wired or wireless medium may include, for example, a metallic conductor link, a radio frequency (RF) communication link, an Infrared (IR) communication link, an optical communication link, or the like, without limitation. The RF communication link may include, for example, WiFi, WiMAX, IEEE 802.11, DECT, 0G, 1G, 2G, 3G or 4G cellular standards, Bluetooth, and the like. One or more communication links may be used in an environment 100 (shown in FIG. 1) to allow sufficient data throughput and interaction between end-users (such as, e.g., agents, consumers, insurance carriers, estate planners, financial providers, web host providers, and the like). Techniques for implementing such communications links are known to those of ordinary skilled in the art.

The terms "including," "comprising," "having," and variations thereof, as used in this disclosure, mean "including, but not limited to," unless expressly specified otherwise.

The terms "a," "an," and "the," as used in this disclosure, means "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

Although process steps, method steps, algorithms, or the like, may be described in a sequential order, such processes, methods and algorithms may be configured to work in alternate orders. In other words, any sequence or order of steps that may be described does not necessarily indicate a requirement that the steps be performed in that order. The steps of the processes, methods or algorithms described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

A "computer-readable medium," as used in this disclosure, means any medium that participates in providing data (for example, instructions) which may be read by a computer. Such a medium may take many forms, including non-volatile media, volatile media, and transmission media. Non-volatile media may include, for example, optical or magnetic disks and other persistent memory. Volatile media may include dynamic random access memory (DRAM). Transmission media may include coaxial cables, copper wire and fiber optics, including the wires that comprise a system bus coupled to the processor. Transmission media may include or convey acoustic waves, light waves and electromagnetic emissions, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, a carrier wave as described hereinafter, or any other medium from which a computer can read.

Various forms of computer-readable media may be involved in carrying sequences of instructions to a computer. For example, sequences of instruction (i) may be delivered from a RAM to a processor, (ii) may be carried over a wireless transmission medium, and/or (iii) may be formatted according to numerous formats, standards or protocols, including, for example, WiFi, WiMAX, IEEE 802.11, DECT, 0G, 1G, 2G, 3G or 4G cellular standards, Bluetooth, or the like.

What is claimed:

1. A method for evaluating and enhancing voice clarity and speech intelligibility in a real-time audio signal, the method comprising:
    separating the audio signal into individual audio channels, each individual audio channel representing one participant in the audio signal;
    for each individual audio channel:
        measuring in real-time, by a custom digital signal processor (DSP) chain, a plurality of clarity/intelligibility-affecting parameters, the plurality of clarity/intelligibility-affecting parameters comprising at least one non-speech parameter;
        determining, by the custom DSP chain, at least one clarity/intelligibility enhancement based on the plurality of clarity/intelligibility-affecting parameters;
        performing the clarity/intelligibility enhancement in real-time based on the plurality of clarity/intelligibility-affecting parameters;
        determining an individual clarity/intelligibility score for each clarity/intelligibility-affecting parameter; and
        combining the individual clarity/intelligibility scores to generate an aggregate clarity/intelligibility score; and
    outputting at least one individual clarity/intelligibility score or aggregate clarity/intelligibility score for at least one audio channel.

2. The method of claim 1, wherein determining the individual clarity/intelligibility score for each clarity/intelligibility-affecting parameter is performed before and after performing the clarity/intelligibility enhancement.

3. The method of claim 1, wherein determining an individual clarity/intelligibility score comprises assigning a score to each clarity/intelligibility-affecting parameter based on experiential rankings of a plurality of pre-recorded audio segments having varied audio characteristics.

4. The method of claim 3, wherein the experiential rankings indicate perceived voice clarity and speech intelligibility of the each pre-recorded audio segment.

5. The method of claim 1, wherein combining the individual clarity/intelligibility scores to generate an aggregate clarity/intelligibility score further comprises:
    calculating a weighted aggregate clarity/intelligibility score;
    calculating a minimum aggregate clarity/intelligibility score; and
    combining the weighted aggregate clarity/intelligibility score and the minimum aggregate clarity/intelligibility score.

6. The method of claim 5, wherein calculating the weighted aggregate clarity/intelligibility score comprises:
    determining, based on the experiential rankings, a weighting factor for each clarity/intelligibility-affecting parameter; and
    multiplying the weighting factor by the individual clarity/intelligibility score.

7. The method of claim 1, wherein the custom DSP chain comprises at least one monitoring DSP and at least one enhancement DSP.

8. The method of claim 1, wherein the custom DSP chain comprises at least one of a music detector, a volume meter, a noise floor detector, a clipping detector, a noise gate, a de-noiser, and an automatic gain controller (AGC).

9. The method of claim 1, wherein the number and type of DSPs in the custom DSP chain is variable.

10. The method of claim 1, further comprising selecting an order of DSPs in the custom DSP chain based on telecommunication system interaction (TSI) conditions.

11. The method of claim 1, wherein the custom DSP chain comprises a music detector configured to detect the presence of music in an audio channel.

12. The method of claim 1, wherein the custom DSP chain comprises a noise gate configured to mute or attenuate audio during periods of silence to eliminate the distraction of background noise.

13. The method of claim 1, further comprising:
    detecting that a new participant has joined a telecommunication system interaction (TSI) in progress;
    separating audio of the new participant; and
    generating a new audio channel for processing the audio for the new participant.

14. The method of claim 13, further comprising:
selecting a different set of custom DSPs to monitor and process the new audio channel.

15. The method of claim 1, wherein the custom DSP chain comprises a first DSP configured to receive the original audio and subsequent DSPs, each subsequent DSP configured to receive an output from the preceding DSP.

16. The method of claim 1, wherein at least one DSP in the custom DSP chain is a software-based DSP.

17. The method of claim 1, further comprising:
detecting a change in a first individual audio channel related to a behavior of a DSP applied in a second individual audio channel; and
reconfiguring the custom DSP chain for the individual audio channel or the second individual audio channel.

18. The method of claim 1, further comprising:
detecting a factor causing audio signal degradation on at least one individual audio channel; and
reconfiguring the custom DSP audio chain for the at least one individual audio channel to overcome the factor.

19. A method for evaluating and enhancing voice clarity and speech intelligibility in a real-time audio signal, the method comprising:
separating the audio signal into individual audio channels, each individual audio channel representing one participant in the audio signal;
for each individual audio channel:
measuring, by a custom digital signal processor (DSP) chain, one or more clarity/intelligibility-affecting parameters;
determining, by the custom DSP chain, at least one clarity/intelligibility enhancement based on the one or more clarity/intelligibility-affecting parameters;
performing the clarity/intelligibility enhancement;
determining an individual clarity/intelligibility score for each clarity/intelligibility-affecting parameter; and
combining the individual clarity/intelligibility scores to generate an aggregate clarity/intelligibility score; and
outputting at least one individual clarity/intelligibility score or aggregate clarity/intelligibility score for at least one audio channel,
wherein determining the individual clarity/intelligibility score for each clarity/intelligibility-affecting parameter is performed before and after performing the clarity/intelligibility enhancement.

20. A method for evaluating and enhancing voice clarity and speech intelligibility in a real-time audio signal, the method comprising:
separating the audio signal into individual audio channels, each individual audio channel representing one participant in the audio signal;
for each individual audio channel:
measuring, by a custom digital signal processor (DSP) chain, one or more clarity/intelligibility-affecting parameters;
determining, by the custom DSP chain, at least one clarity/intelligibility enhancement based on the one or more clarity/intelligibility-affecting parameters;
performing the clarity/intelligibility enhancement;
determining an individual clarity/intelligibility score for each clarity/intelligibility-affecting parameter; and
combining the individual clarity/intelligibility scores to generate an aggregate clarity/intelligibility score; and
outputting at least one individual clarity/intelligibility score or aggregate clarity/intelligibility score for at least one audio channel,
wherein determining an individual clarity/intelligibility score comprises assigning a score to each clarity/intelligibility-affecting parameter based on experiential rankings of a plurality of pre-recorded audio segments having varied audio characteristics.

* * * * *